(12) United States Patent
Chen et al.

(10) Patent No.: US 10,262,870 B2
(45) Date of Patent: Apr. 16, 2019

(54) FIN FIELD EFFECT TRANSISTOR (FINFET) DEVICE STRUCTURE AND METHOD FOR FORMING THE SAME

(71) Applicant: TAIWAN SEMICONDUCTOR MANUFACTURING CO., LTD., Hsinchu (TW)

(72) Inventors: Chang-Yin Chen, Taipei (TW); Chai-Wei Chang, New Taipei (TW); Chia-Yang Liao, Hsinchu (TW); Bo-Feng Young, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/942,580

(22) Filed: Nov. 16, 2015

(65) Prior Publication Data
US 2017/0005165 A1    Jan. 5, 2017

Related U.S. Application Data

(60) Provisional application No. 62/188,028, filed on Jul. 2, 2015.

(51) Int. Cl.
*H01L 29/78* (2006.01)
*H01L 21/311* (2006.01)
(Continued)

(52) U.S. Cl.
CPC .. *H01L 21/31144* (2013.01); *H01L 21/28008* (2013.01); *H01L 21/31111* (2013.01);
(Continued)

(58) Field of Classification Search
CPC .......... H01L 29/0649; H01L 21/28008; H01L 21/31111; H01L 21/31144; H01L 29/0692; H01L 29/42376; H01L 29/66795; H01L 29/785; H01L 29/7855–29/7856; H01L 29/06; H01L 29/78; H01L 27/088; H01L 21/311; H01L 29/66; H01L 21/28;
(Continued)

(56) References Cited

U.S. PATENT DOCUMENTS 6,762,129 B2 *  7/2004  Yamashita ............... H01J 37/32
                                                      257/E21.218
9,064,943 B1    6/2015  Anderson et al.
(Continued)

FOREIGN PATENT DOCUMENTS

| DE | 102015105856 A1 | 3/2016 |
|----|-----------------|--------|
| DE | 102016100035 A1 | 1/2017 |
| TW | 201517272 A     | 5/2015 |

*Primary Examiner* — William F Kraig
*Assistant Examiner* — Khatib A Rahman
(74) *Attorney, Agent, or Firm* — Slater Matsil, LLP

(57) ABSTRACT

A FinFET device structure and method for forming the same are provided. The fin field effect transistor (FinFET) device structure includes a fin structure formed over a substrate and a gate structure traversing over the fin structure. The gate structure includes a gate electrode layer which includes an upper portion above the fin structure and a lower portion below the fin structure. The upper portion has a top surface with a first width, the lower portion has a bottom surface with a second width, and the first width is greater than the second width.

20 Claims, 15 Drawing Sheets

(51) Int. Cl.
*H01L 29/423* (2006.01)
*H01L 29/66* (2006.01)
*H01L 21/28* (2006.01)

(52) U.S. Cl.
CPC .. *H01L 29/42376* (2013.01); *H01L 29/66545* (2013.01); *H01L 29/66795* (2013.01); *H01L 29/785* (2013.01); *H01L 29/7856* (2013.01)

(58) Field of Classification Search
CPC ............... H01L 29/423; H01L 27/0886; H01L 29/6681; H01L 21/845; H01L 21/823431
See application file for complete search history.

(56) References Cited

U.S. PATENT DOCUMENTS

| | | |
|---|---|---|
| 2003/0049876 A1 | 3/2003 | Mori et al. |
| 2008/0296707 A1 | 12/2008 | Anderson et al. |
| 2009/0134454 A1 | 5/2009 | Takeuchi et al. |
| 2009/0206406 A1 | 8/2009 | Rachmady et al. |
| 2011/0241118 A1* | 10/2011 | Ng .................... H01L 21/28114 257/364 |
| 2013/0059435 A1 | 3/2013 | Yang et al. |
| 2013/0256764 A1* | 10/2013 | Liaw .................... H01L 29/7853 257/288 |
| 2013/0270655 A1 | 10/2013 | Adam et al. |
| 2013/0292777 A1 | 11/2013 | Liaw |
| 2013/0299918 A1* | 11/2013 | Kim ........................ H01L 29/78 257/402 |
| 2014/0001559 A1* | 1/2014 | Lin .................... H01L 29/66795 257/368 |
| 2015/0115363 A1 | 4/2015 | Chang et al. |
| 2015/0187946 A1* | 7/2015 | Park ..................... H01L 29/785 257/288 |
| 2015/0236123 A1 | 8/2015 | Chang et al. |
| 2016/0111531 A1* | 4/2016 | Dong .................... H01L 29/785 257/288 |
| 2016/0093537 A1 | 5/2016 | Chen et al. |
| 2016/0181399 A1* | 6/2016 | Jun .................... H01L 29/66553 438/294 |
| 2017/0005005 A1 | 1/2017 | Chen et al. |

* cited by examiner

FIN FIELD EFFECT TRANSISTOR (FINFET) DEVICE STRUCTURE AND METHOD FOR FORMING THE SAME

CROSS REFERENCE TO RELATED APPLICATIONS

This application claims the benefit of U.S. Provisional Application No. 62/188,028, filed on Jul. 2, 2015, and entitled "fin field effect transistor (FinFET) device structure and method for forming the same", the entirety of which is incorporated by reference herein. This application is related to the following co-pending a commonly assigned patent application: U.S. Ser. No. 14/942,491, filed on Nov. 16, 2015 and entitled "Fin field effect transistor (FinFET) device structure and method for forming the same", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

As the semiconductor industry has progressed into nanometer technology process nodes in pursuit of higher device density, better performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate structure is provided over the fin. Advantages of the FinFET may include reducing the short channel effect and providing a higher current flow.

Although existing FinFET devices and methods of fabricating FinFET devices have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 4D' shows an enlarged representation of region A of FIG. 4D, in accordance with some embodiments of the disclosure.

DETAILED DESCRIPTION

Figure 1:
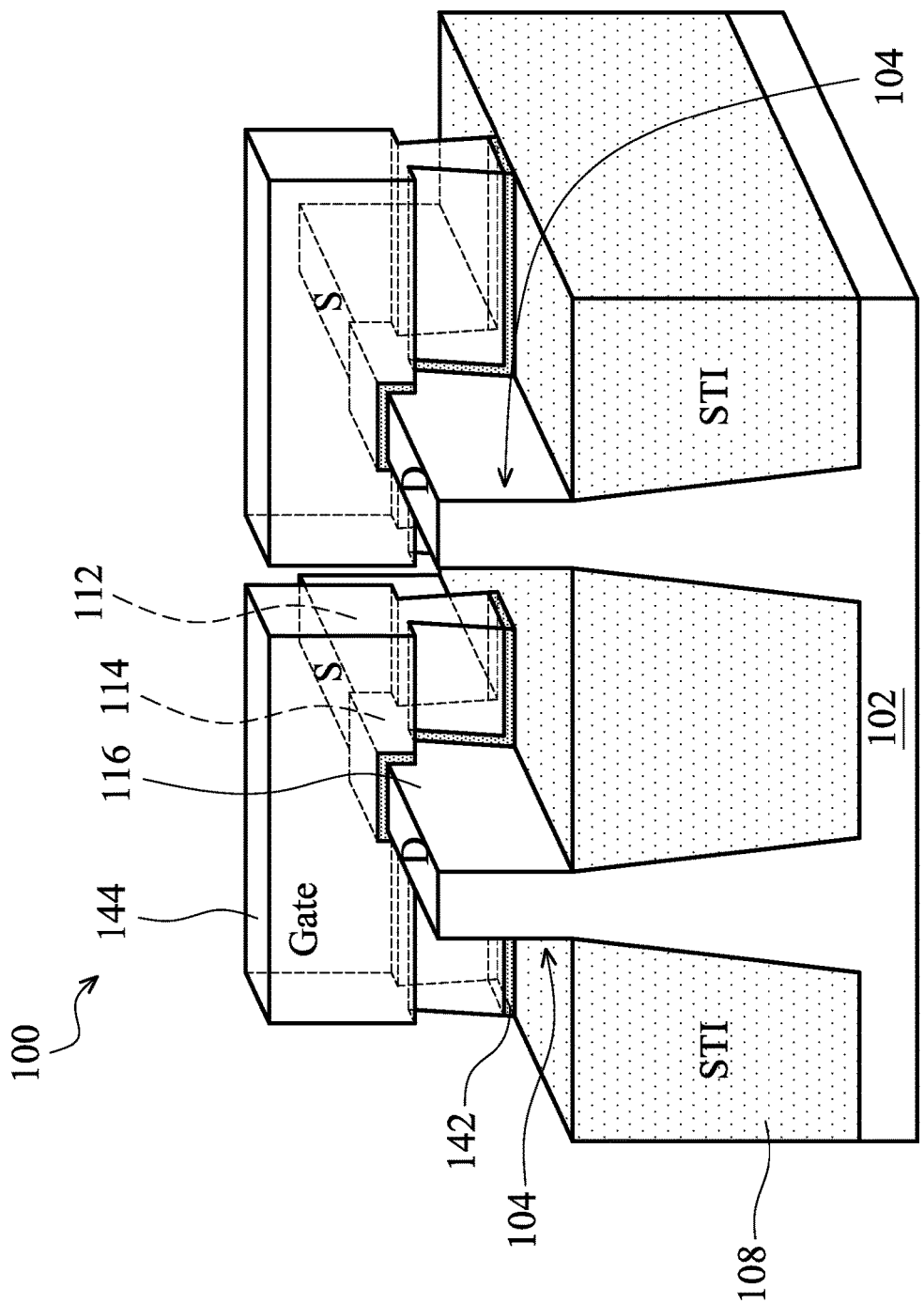
FIG. 1 shows a perspective representation of a fin field effect transistor (FinFET) device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a fin field effect transistor (FinFET) device structure are provided. FIG. 1 shows a perspective representation of a fin field effect transistor (FinFET) device structure 100, in accordance with some embodiments of the disclosure.

Referring to FIG. 1A, a substrate 102 is provided. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

The FinFET device structure 100 also includes one or more fin structures 104 (e.g., Si fins) that extend from the substrate 102. The fin structures 104 may optionally include germanium. The fin structures 104 may be formed by using suitable processes such as photolithography and etching processes. In some embodiments, the fin structures 104 are etched from the substrate 102 using dry etch or plasma processes.

An isolation structure 108, such as a shallow trench isolation (STI) structure, is formed to surround fin structures 104. In some embodiments, a lower portion of the fin structures 104 is surrounded by the isolation structure 108, and an upper portion of the fin structures 104 protrudes from the isolation structure 108, as shown in FIG. 1. In other words, a portion of the fin structures 104 is embedded in the isolation structure 108. The isolation structure 108 prevents electrical interference or crosstalk.

The FinFET device structure 100 further includes a gate stack structure including a gate electrode layer 144 and a gate dielectric layer 142. The gate stack structure is formed over a central portion of the fin structures 104. In some embodiments, multiple gate stack structures are formed over the fin structures 104. Numerous other layers may also be present in the gate structures, for example, capping layers, interface layers, spacer elements, and/or other suitable features.

The gate dielectric layer 142 may include dielectric materials, such as silicon oxide, silicon nitride, silicon oxynitride, dielectric material(s) with high dielectric constant (high-k), or combinations thereof. Examples of high-k dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, the like, or combinations thereof.

The gate electrode layer 144 may include polysilicon or metal. Metal includes tantalum nitride (TaN), nickel silicon (NiSi), cobalt silicon (CoSi), molybdenum (Mo), copper (Cu), tungsten (W), alumina (Al), cobalt (Co), zirconium (Zr), platinum (Pt), or other applicable materials. The gate electrode layer 144 may be formed in a gate last process (or gate replacement process). In some embodiments, the gate stack structure includes additional layers, such as interfacial layers, capping layers, diffusion/barrier layers, or other applicable layers.

The fin structures 104 includes a channel region 114 surrounded or wrapped by the gate electrode layer 144 and the gate dielectric layer 142. The fin structures 104 may be doped to provide a suitable channel for an n-type FinFET (NMOS device) or a p-type FinFET (PMOS device). The fin structures 104 may be doped using a suitable process, such as an ion implantation process, diffusion process, annealing process, other applicable processes, or combinations thereof. The fin structures 104 include a channel region 114 between the source region 112 and the drain region 116. The FinFET device 100 may be a device included in a microprocessor, memory cell (e.g., Static Random-Access Memory (SRAM)), and/or other integrated circuits.

FIGS. 2A-2M show cross-sectional representations of various stages of forming a fin field effect transistor (FinFET) device structure 100, in accordance with some embodiments of the disclosure.

Figure 2A:
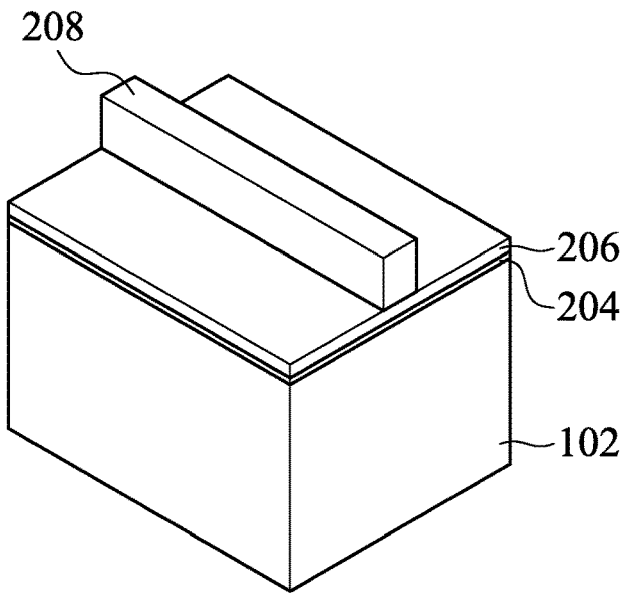
FIGS. 2A-2M show cross-sectional representations of various stages of forming a fin field effect transistor (FinFET) device structure, in accordance with some embodiments of the disclosure.

Referring to FIG. 2A, a dielectric layer 204 and a hard mask layer 206 are formed on the substrate 102, and a photoresist layer 208 is formed on the hard mask layer 206. The photoresist layer 208 is patterned by a patterning process. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process.

The dielectric layer 204 is a buffer layer between the substrate 102 and the hard mask layer 206. In addition, the dielectric layer 204 is used as a stopping layer when the hard mask layer 206 is removed. The dielectric layer 204 may be made of silicon oxide. The hard mask layer 206 may be made of silicon oxide, silicon nitride, silicon oxynitride, or another applicable material. In some other embodiments, more than one hard mask layer 206 is formed on the dielectric layer 204.

The dielectric layer 204 and the hard mask layer 206 are formed by deposition processes, such as a chemical vapor deposition (CVD) process, high-density plasma chemical vapor deposition (HDPCVD) process, spin-on process, sputtering process, or other applicable processes.

Figure 2B:
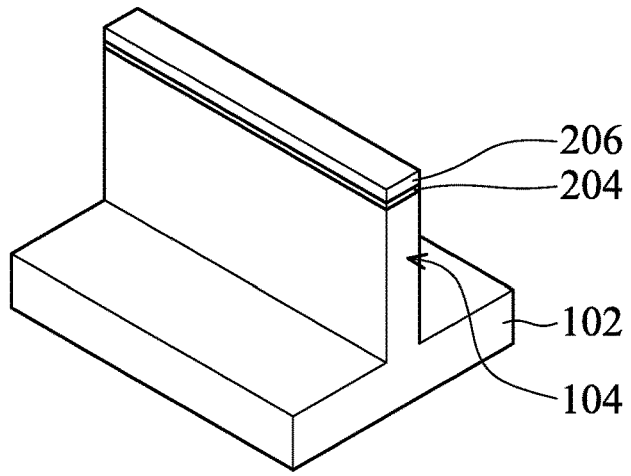

After the photoresist layer 208 is patterned, the dielectric layer 204 and the hard mask layer 206 are patterned by using the patterned photoresist layer 208 as a mask as shown in FIG. 2B, in accordance with some embodiments. As a result, a patterned dielectric layer 204 and a patterned hard mask layer 206 are obtained. Afterwards, the patterned photoresist layer 208 is removed.

Afterwards, an etching process is performed on the substrate 102 to form the fin structure 104 by using the patterned dielectric layer 204 and the patterned hard mask layer 206 as a mask. The etching process may be a dry etching process or a wet etching process. The etching process may be a time-controlled process, and continue until the fin structure 104 reaches a predetermined height.

It should be noted that the number of the fin structures 104 may be adjusted according to actual application, and it is not limited to one fin structure 104. In some embodiments, the fin structure 104 has a width that gradually increases from the top portion to the lower portion.

Figure 2C:
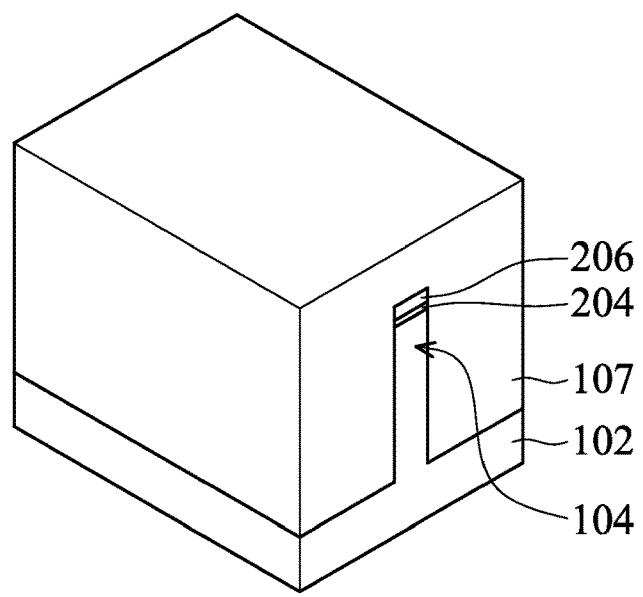

Afterwards, a dielectric material 107 is formed on the fin structure 104 as shown in FIG. 2C, in accordance with some embodiments. In some embodiments, the dielectric material 107 is made of silicon oxide, silicon nitride, silicon oxynitride, fluoride-doped silicate glass (FSG), or other low-k dielectric materials. The dielectric material 107 may be deposited by a chemical vapor deposition (CVD) process, a spin-on-glass process, or another applicable process.

Figure 2D:
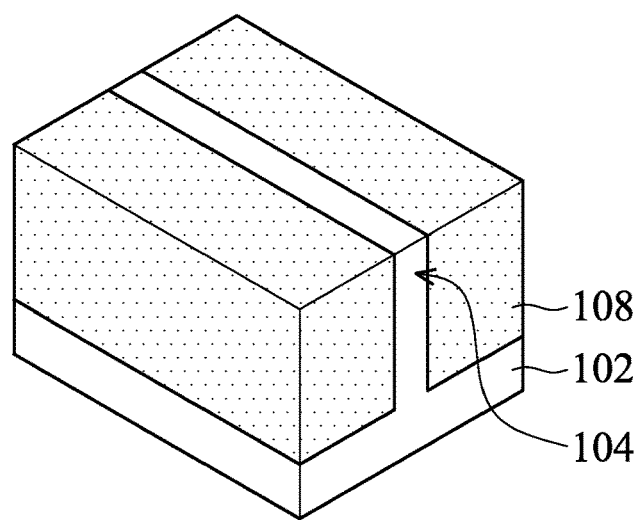

Afterwards, the dielectric material 107 is thinned or planarized to form an isolation structure 108 as shown in FIG. 2D, in accordance with some embodiments. In some embodiments, the dielectric material 107 is thinned by a chemical mechanical polishing (CMP) process. As a result, a top portion of the fin structure 104 is exposed, and the dielectric layer 204 and the hard mask layer 206 are removed. The top surface of the isolation structure 108 is level with the top surface of the fin structure 104.

Figure 2E:
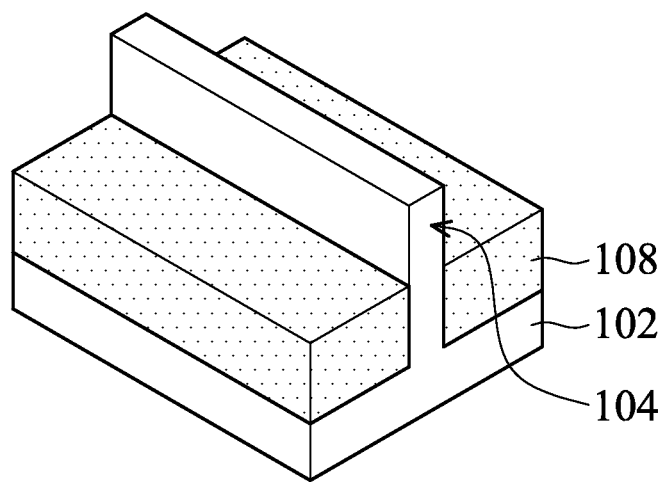

Afterwards, the top portion of the isolation structure 108 is removed as shown in FIG. 2E, in accordance with some embodiments. As a result, the fin structure 104 protrudes from the isolation structure 108. In other words, the top portion of the fin structure 104 is higher than the isolation structure 108. The top portion of the isolation structure 108 is removed by a wet etching process or a dry etching process. The remaining isolation structure 108 is seen as a shallow trench isolation (STI) structure.

Figure 2F:
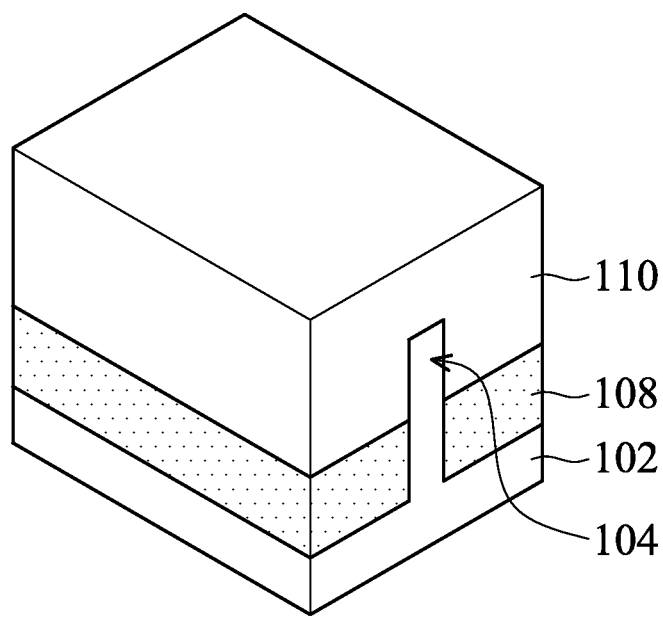

Afterwards, a dummy gate electrode layer 110 are formed over the fin structure 104 and the isolation structure 108 as shown in FIG. 2F, in accordance with some embodiments.

In some embodiments, the dummy gate electrode layer 110 is made of conductive or non-conductive materials. In some embodiments, the dummy gate electrode layer 110 is made of polysilicon. The dummy gate electrode layer 110 is formed by a deposition process, such as chemical vapor deposition (CVD), physical vapor deposition (PVD), atomic layer deposition (ALD), high density plasma CVD (HDP-CVD), metal organic CVD (MOCVD), or plasma enhanced CVD (PECVD).

Figure 2G:
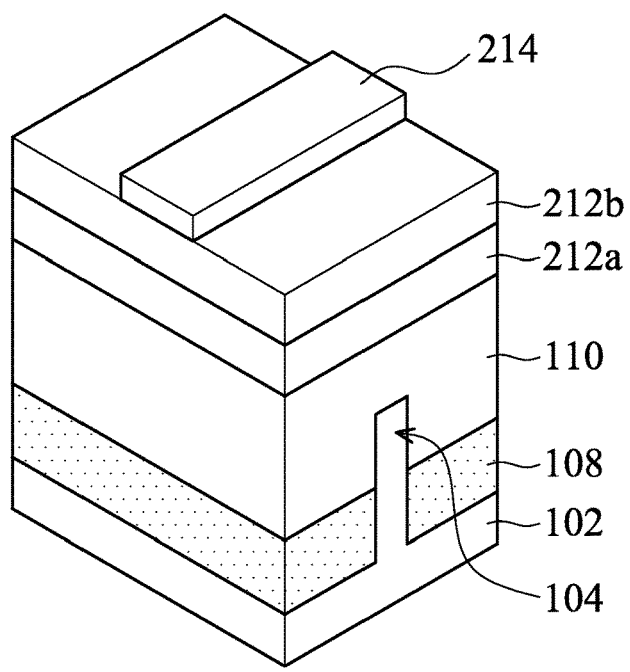

After the dummy gate electrode layer 110 is formed, a first hard mask layer 212a and a second hard mask layer 212b are formed over the dummy gate electrode layer 110 as shown in FIG. 2G, in accordance with some embodiments. A photoresist layer 214 is formed over the second hard mask layer 212b. Afterwards, the photoresist layer 214 is patterned to form a patterned photoresist layer 214. The patterned photoresist layer 214 is used for protecting the underlying layers from being etched during the subsequent processes.

Figure 2H:
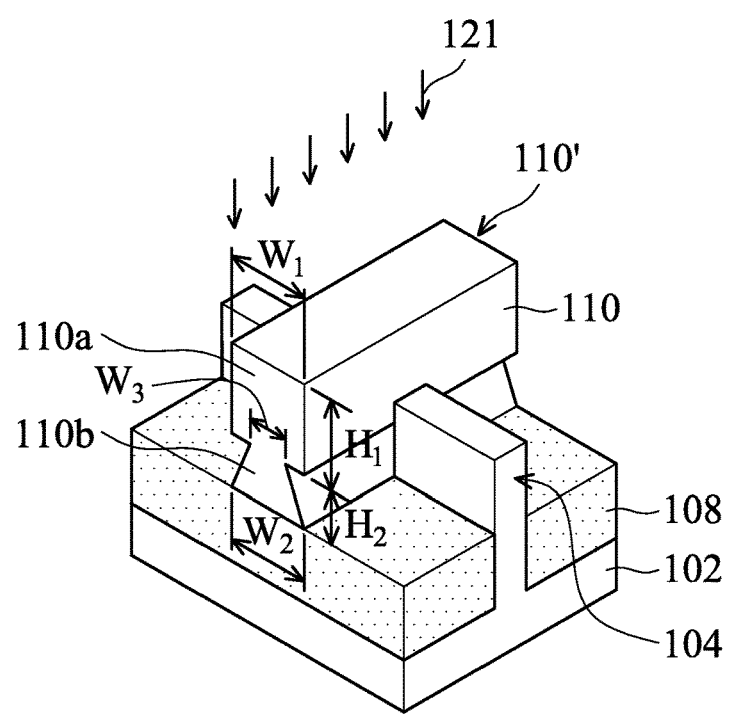

Afterwards, the first hard mask layer 212a and the second hard mask layer 212b are patterned, and a portion of the dummy gate electrode layer 110 are removed to form a dummy gate structure 110' as shown in FIG. 2H, in accordance with some embodiments. The portions of the dummy gate electrode layer 110 are removed by an etching process 121, such as a wet etching process or a dry etching process.

The dummy gate structure 110' includes an upper portion 110a above a top surface of the fin structure 104 and a lower portion 110b below the top surface of the fin structure 104. The upper portion 110a has vertical sidewalls, and the lower portion 110b has sloped sidewalls. The lower portion 110b has trapezoidal shape (shown in FIG. 4D').

The upper portion 110a has a top surface with a first width $W_1$, and the lower portion 110b has a bottom surface with a second width $W_2$. The lower portion 110b has a tapered width which is gradually tapered from the bottom surface of the lower portion to a top surface of the lower portion.

A virtual interface is formed between the upper portion 110a and the lower portion 110b. The virtual interface has a third width $W_3$. In some embodiments, the first width $W_1$ is greater than the second width $W_2$. In some embodiments, the third width $W_3$ is smaller than or equal to the second width $W_2$. In some embodiments, the difference ($\Delta W=W_2-W_3$) between the second width $W_2$ and the third width $W_3$ is in a range from about 0 nm to about 15 nm. If the difference ($\Delta W$) is greater than 15 nm, the gate electrode layer 144 (shown in FIG. 2M) may be difficult to fill into the trench 138 (shown in FIG. 2L) which is formed by removing the dummy gate electrode layer 110. If the difference is smaller than 0 nm, it may be difficult to form the source/drain (S/D) structures 116 (shown in FIG. 2J).

The virtual interface is used to define two portions and no real interface is formed between the upper portion 110a and the lower portion 110b. The interface may be considered as a bottom surface of the upper portion 110a. In addition, the interface may be considered as a top surface of the lower portion 110b. In some embodiments, the virtual interface is substantially level with a top surface of the fin structure 104.

If the upper portion of the dummy gate structure 110' has an extending portion in horizontal direction, the gate structure may protrude when the dummy gate structure 110' is replaced by the gate structure. The protruded gate structure may be in contact with a contact structure which is formed adjacent to the protruded gate structure. As a result, an electrical shorting problem may occur. More specifically, the protrusion problem of the gate electrode layer 144 may degrade the performance of the FinFET device structure 100.

The substrate 102 is a portion of a wafer. In some embodiments, the wafer includes a central region and an edge region, and the protrusion problem is exacerbated in the edge region of the wafer compared with that in the center region. Therefore, the etching gas in the edge region should be well controlled.

In order to solve the protrusion problem, as shown in in FIG. 2H, the dummy gate structure 110' is etched to form a vertical upper portion 110a and a notched lower portion 110b below the fin structure 104. In other words, the notched lower portion 110b of the dummy gate structure 110' has a recessed sidewall portion.

The upper portion 110a has a first height $H_1$, and the lower portion 110b has a second height $H_2$. In some embodiments, the first height $H_1$ is greater than the second height $H_2$.

Figure 2I:
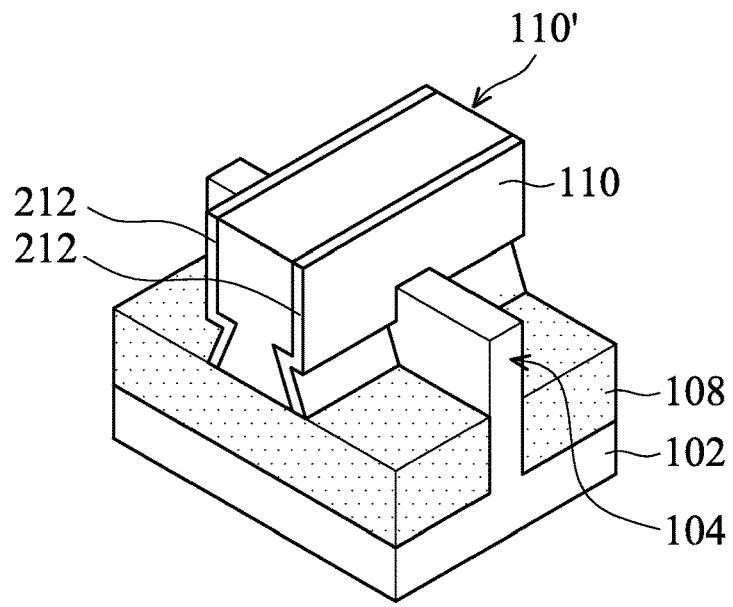

After the dummy gate structure 110' is formed, spacers 212 are formed on the opposite sidewalls of the dummy gate structure 110' as shown in FIG. 2I, in accordance with some embodiments. In some embodiments, the spacers 212 are made of silicon nitride, silicon carbide, silicon oxynitride, silicon carbon, silicon oxide, silicon hydrogen, other applicable materials, or a combination thereof.

Figure 2J:
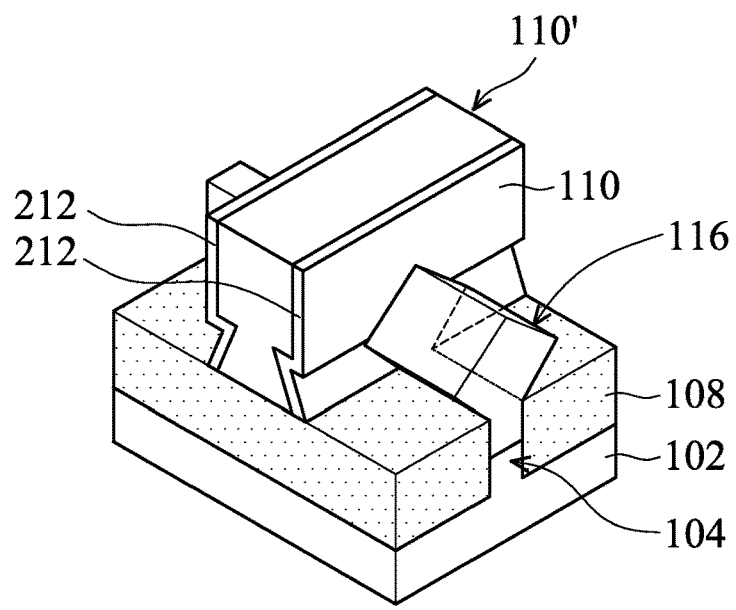

Afterwards, a top portion of the fin structure 104 is removed to form a recess (not shown), and the source/drain (S/D) structures 116 are formed in the recess as shown in FIG. 2J, in accordance with some embodiments.

In some embodiments, the S/D structures 116 are strained source/drain structures. In some embodiments, the S/D structures 116 are formed by growing a strained material in the recesses of the fin structure 104 by an epitaxial (epi) process. In addition, the lattice constant of the strained material may be different from the lattice constant of the substrate 102.

In some embodiments, the source/drain structures 116 include Ge, SiGe, InAs, InGaAs, InSb, GaAs, GaSb, InAlP, InP, or a combination thereof. The epitaxial process may include a selective epitaxy growth (SEG) process, CVD deposition techniques (e.g., vapor-phase epitaxy (VPE) and/or ultra-high vacuum CVD (UHV-CVD)), molecular beam epitaxy, or other suitable epi processes.

In some embodiments, after the S/D structures 116 are formed, a contact etch stop layer (CESL) (not shown) is formed on the S/D structures 116 and the dummy gate structure 110'. In some embodiments, the contact etch stop layer is made of silicon nitride, silicon oxynitride, and/or other applicable materials. The contact etch stop layer may be formed by plasma enhanced CVD, low pressure CVD, ALD, or other applicable processes.

Figure 2K:
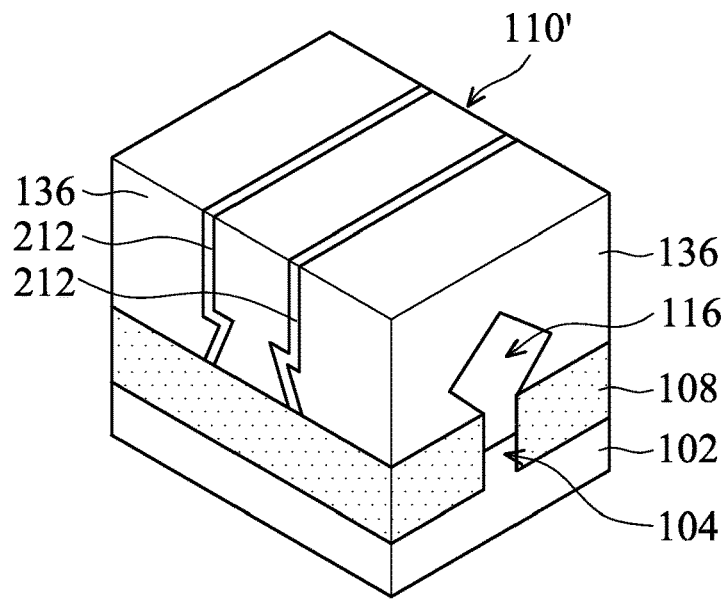

Afterwards, an inter-layer dielectric (ILD) material is formed over the fin structure 104 over the substrate 102 as shown in FIG. 2K, in accordance with some embodiments. In some embodiments, an inter-layer dielectric (ILD) material is formed over the isolation structure 108 and then is planarized to form the ILD structure 136.

Figure 2L:
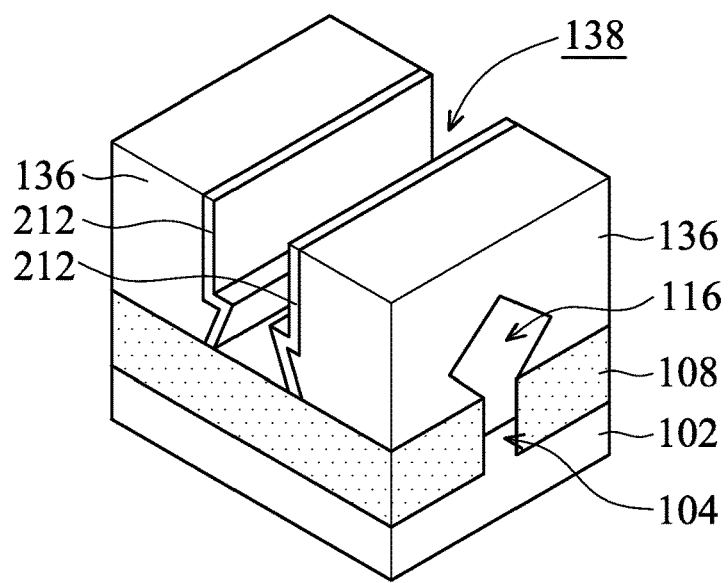

After the ILD structure 136 is formed, the dummy gate structure 110' is removed by form a trench 138 in the ILD structure 136 as shown in FIG. 2L, in accordance with some embodiments. The dummy gate structure 110' is removed by performing an etching process. It should be noted that the fin structure 104 is not removed, and thus the middle portion of the fin structure 104 is exposed by the trench 138.

Figure 2M:
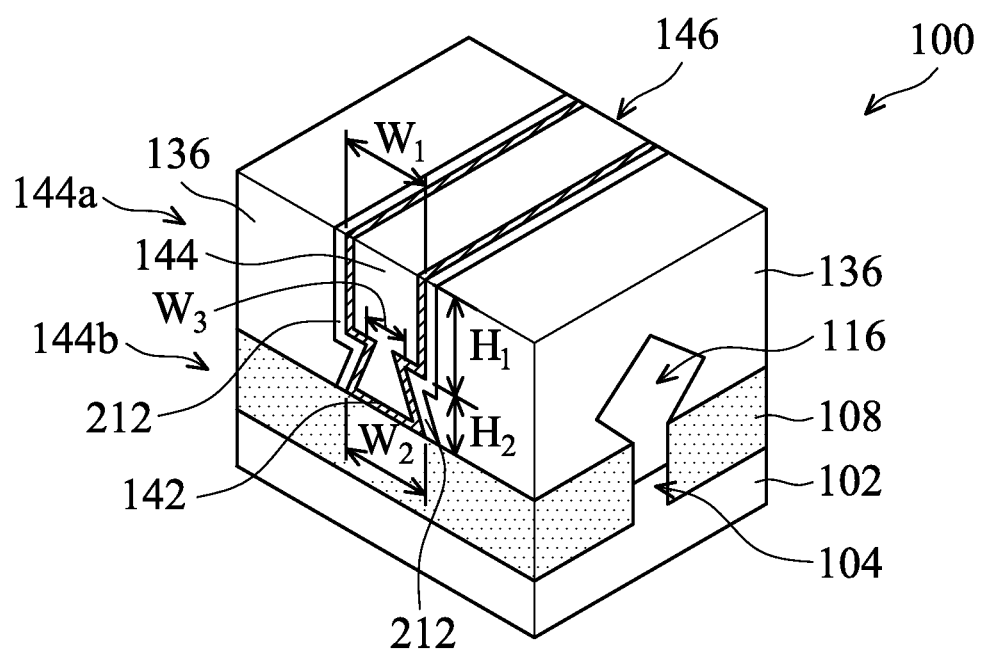

After the trench 138 is formed, a gate dielectric layer 142 and a gate electrode 144 are sequentially formed in the trench 138 as shown in FIG. 2M, in accordance with some embodiments. Therefore, a gate structure 146 including the gate dielectric layer 142 and the gate electrode layer 144 is obtained.

The gate dielectric layer 142 has an upper portion higher than the top surface of the fin structure 104 and a lower portion lower than the top surface of the fin structure 104.

In some embodiments, the gate dielectric layer 142 is made of a high-k dielectric material. The high-k dielectric material may include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, or the like.

The gate electrode layer 144 has an upper portion higher than the top surface of the fin structure 104 and a lower portion lower than the top surface of the fin structure 104. The upper portion of the gate electrode layer 144 has a constant width, and the lower portion of gate electrode layer 144 has a varied width.

In some embodiments, the gate electrode layer 144 is made of a metal material. The metal material may include N-work-function metal or P-work-function metal. The N-work-function metal includes tungsten (W), copper (Cu), titanium (Ti), silver (Ag), aluminum (Al), titanium aluminum alloy (TiAl), titanium aluminum nitride (TiAlN), tantalum carbide (TaC), tantalum carbon nitride (TaCN), tantalum silicon nitride (TaSiN), manganese (Mn), zirconium (Zr) or combinations thereof. The P-work-function metal includes titanium nitride (TiN), tungsten nitride (WN), tantalum nitride (TaN), ruthenium (Ru) or combinations thereof.

As shown in FIG. 2M, the gate electrode layer 144 has an upper portion 144a and a lower portion 144b. The upper portion 144a has vertical sidewalls, and the lower portion 144b has sloped sidewalls. The lower portion 144b has a tapered width which is gradually tapered from the bottom surface of the lower portion 144b to a top surface of the lower portion 144b. It should be noted that the upper portion 144a of the gate electrode layer 144 has vertical sidewalls to prevent the protruding portion. Therefore, the performance of the FinFET structure 100 is improved.

The upper portion 144a of the gate electrode layer 144 has a first height, and the lower portion 144b of the gate electrode layer 144 has a second height. The first height is greater than the second height to fill more metal material above the fin structure 104.

The upper portion 144a has a top surface with a first width, and the lower portion 144b has a bottom surface with a second width. The first width is greater than the second width. It should be noted that the drain-induced barrier lowering (DIBL) effect is prevented when the first width is greater than the second width. In addition, the tailing problem (spread Vbd over a broader range of voltage values) of breakdown voltage (Vbd) is prevented when the first width is greater than the second width.

Figure 3:
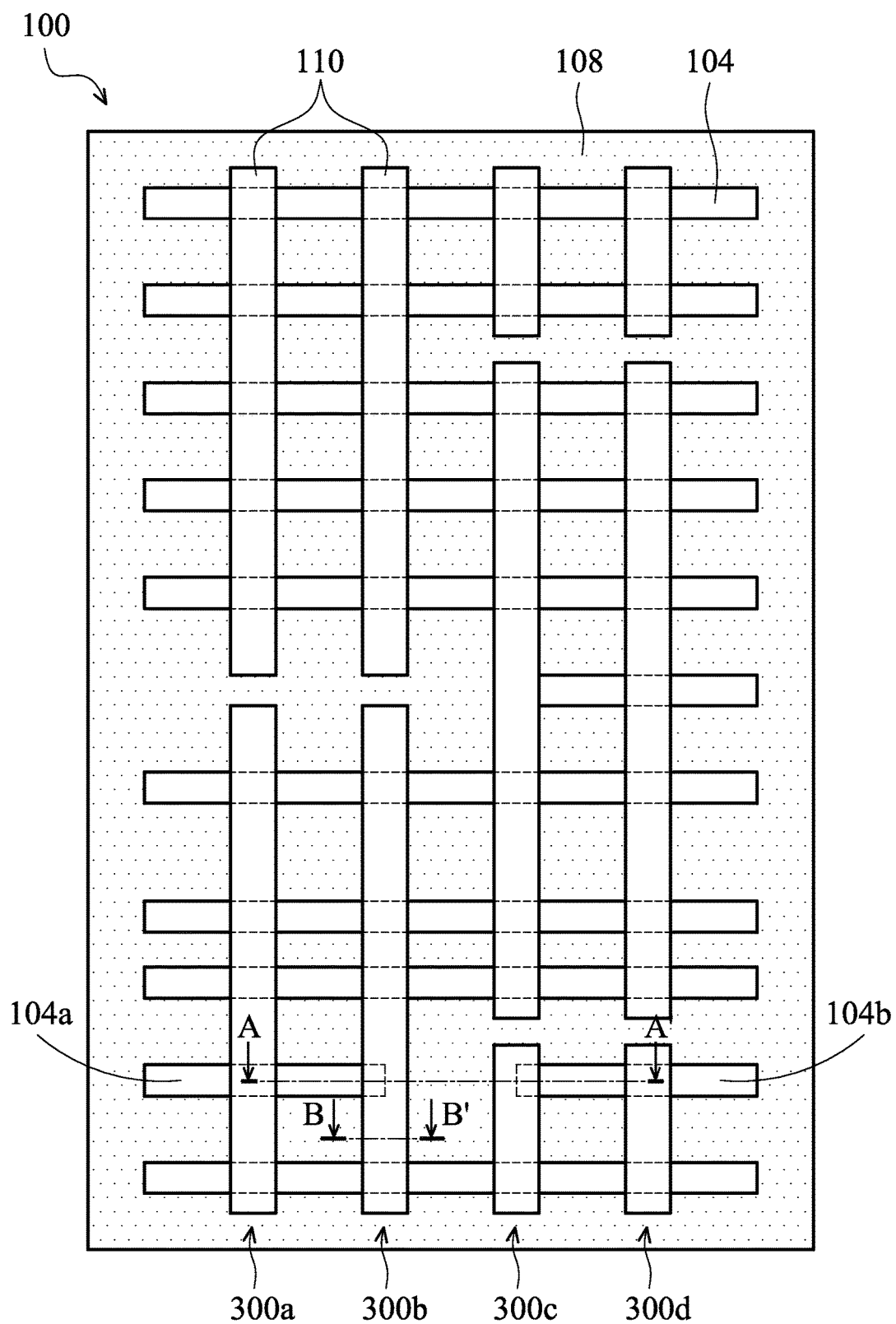
FIG. 3 shows a top-view of a fin field effect transistor (FinFET) device structure, in accordance with some embodiments of the disclosure.

FIG. 3 shows a top-view of a fin field effect transistor (FinFET) device structure 100, in accordance with some embodiments of the disclosure. The FinFET device structure 100 includes multiple fin structures 104 and multiple gate structures 110. The gate structures 110 traverse over the fin structures 104. The FinFET device structure 100 is surrounded by the isolation structure 108.

As shown in FIG. 3, the fin structures 104 may be substantially parallel to each other. The gate structures 110 may also be parallel to each other and substantially perpendicular to the fin structures 104. In some embodiments, the gate structures 110 are also called gate electrode lines when seen from a top-view.

A first gate transistor 300a and a second gate transistor 300b are formed over a first fin structure 104a. A third gate transistor 300c and a fourth gate transistor 300d are formed over a second fin structure 104b.

FIGS. 4A-4F show cross-sectional representations of various stages of forming a fin field effect transistor (FinFET) device structure 100, in accordance with some embodiments of the disclosure. FIGS. 4A-4F show cross-sectional representations taken along AA' line of FIG. 3.

Figure 4A:
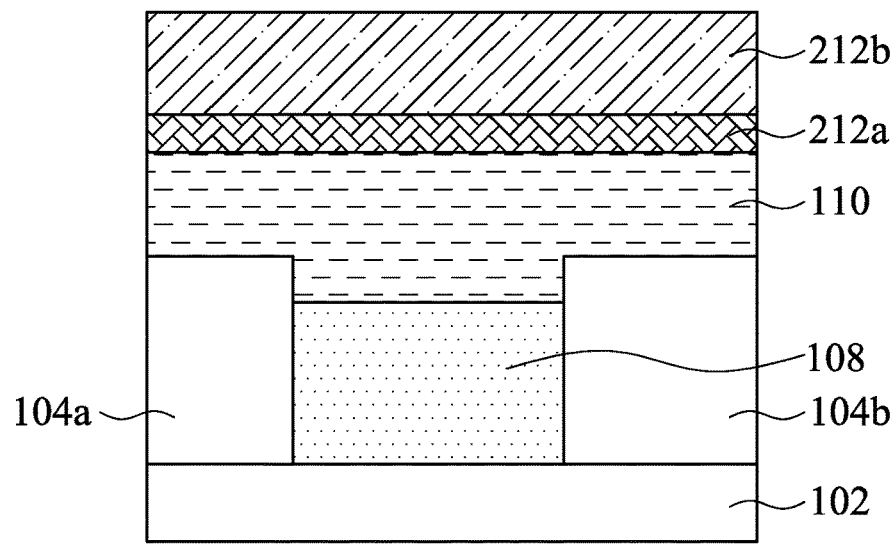
FIGS. 4A-4F show cross-sectional representations of various stages of forming a FinFET device structure, in accordance with some embodiments.

Referring to FIG. 4A, the gate electrode layer 110 is formed over the first fin structure 104a, the second fin structure 104b and the isolation structure 108. The top surface of the isolation structure 108 is lower than the top surface of the fin structure 104. Afterwards, the first hard mask layer 212a and the second hard mask layer 212b are formed over the gate electrode layer 110.

Figure 4B:
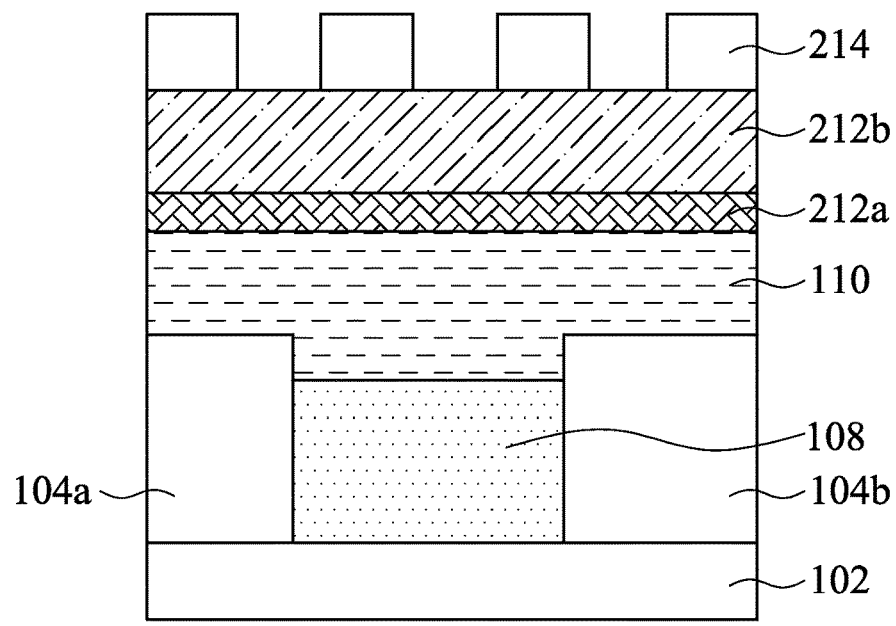

After forming the second hard mask layer 212b, the photoresist layer 214 is formed over the second hard mask layer 212b as shown in FIG. 4B, in accordance with some embodiments of the disclosure. Afterwards, the photoresist layer 214 is patterned.

Figure 4C:
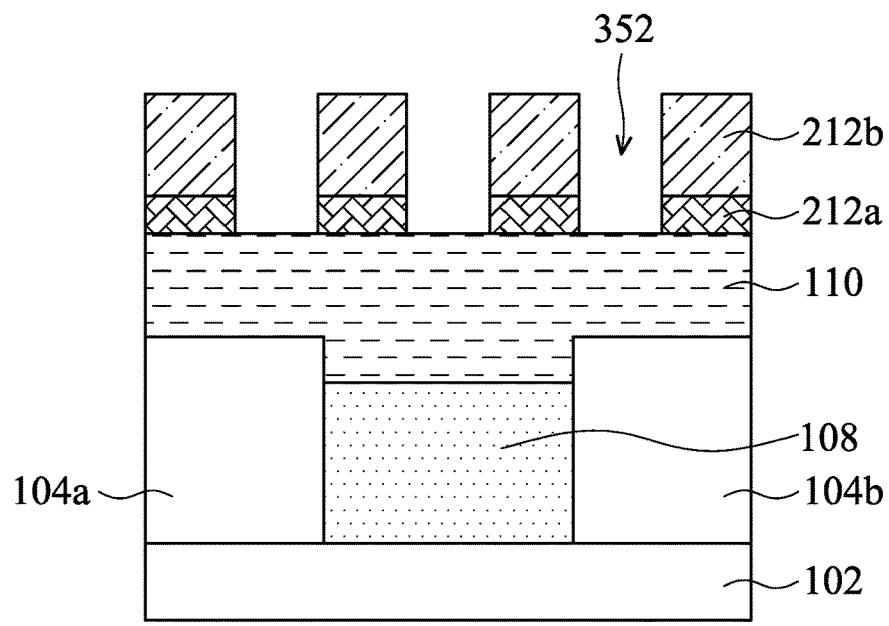

After pattering the photoresist layer 214, a portion of the first hard mask layer 212a and a portion of the second hard mask layer 212b are patterned to form trenches 352 as shown in FIG. 4C, in accordance with some embodiments of the disclosure.

Figure 4D:
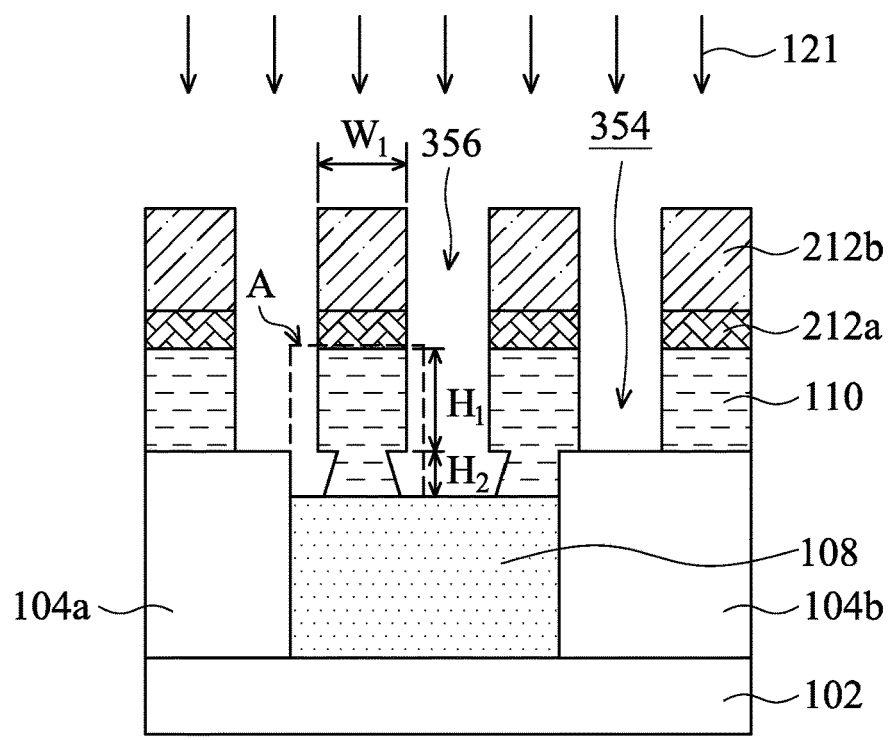
Figure 4D:
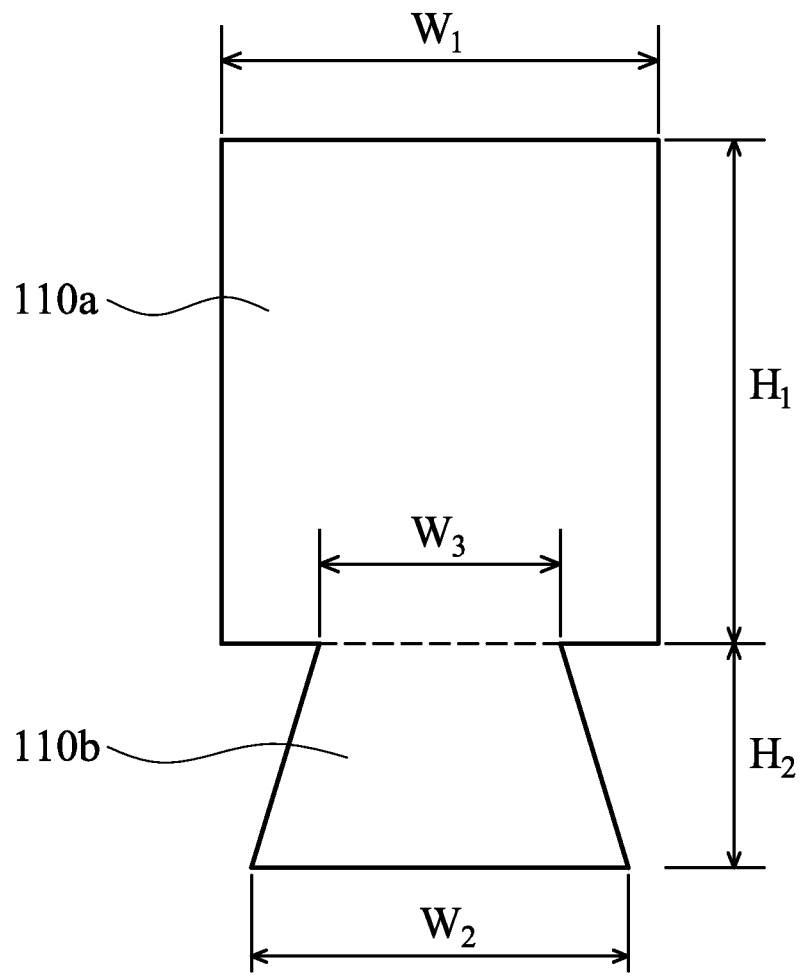

After the trenches 352 are formed, a portion of the gate electrode layer 110 are patterned by using the first hard mask layer 212a and the second hard mask layer 212b as a mask as shown in FIG. 4D, in accordance with some embodiments of the disclosure. As a result, a first trench 354 is formed above the fin structure 104 and in the gate electrode layer 110. A second trench 356 is formed above the isolation structure 108 and in the gate electrode layer 110.

The portions of the gate electrode layer 110 are removed by the etching process 121. In some embodiments, the etching process is a plasma process. The plasma process includes using an etching gas, such as HBr. In some embodiments, helium (He) and oxygen ($O_2$) gas are also used in the plasma process. The flow rate of the etching gas in the etching process is in a range from about 700 sccm to about 1000 sccm. If the flow rate is smaller than 700 sccm, the etching selectivity may be poor. If the flow rate is greater than 1000 sccm, the etching rate may be difficult to control.

In some embodiments, plasma process is performed at a power in a range from about 350 Watt to about 1500 Watt. If the power is smaller than 350 W, the etching selectivity is poor. If the power is greater than 1500 W, the etching rate may be difficult to control. In some embodiments, the plasma process is performed at a pressure in a range from about 10 torr to about 100 torr. If the pressure is smaller than 10 torr, the etching selectivity is poor. If the pressure is greater than 100 torr, the etching rate may be difficult to control.

It should be noted that the substrate 102 is a portion of a wafer, and the wafer includes a central region and an edge region. The dimension of the second width $W_2$ in the edge region of the wafer is hard to control than that in the central region of the wafer. In order to make the second width $W_2$ larger than or equal to the third width $W_3$, in some embodiments, a ratio of an amount of the etching gas in the edge region to that of the etching gas in overall region is in a range from about 10 vol. % to about 50 vol. %. If the ratio of the etching gas is smaller than 10 vol. % or larger than 50%, the loading effect between the central region and the edge region may increase, and therefore the dimension of the first width $W_1$ or the second width $W_2$ is difficult to control.

FIG. 4D' shows an enlarged representation of region A of FIG. 4D, in accordance with some embodiments of the disclosure. As shown in FIG. 4D', the gate electrode layer 110 includes the upper portion 110a and the lower portion 110b. The upper portion 110a is located at a position that is higher than the top surface of the fin structures 104a, 104b. The lower portion 110b is located at a position that is lower than the top surface of the fin structures 104a, 104b. The upper portion 110a of the gate electrode layer 110 has vertical sidewalls and the lower portion 110b of the gate electrode layer 110 has sloped sidewalls.

An interface is formed between the upper portion 110a and the lower portion 110b. The interface is not a real boundary and it is used to define the shape of the gate electrode layer 110. The interface may be considered as a bottom surface of the upper portion 110a. In addition, the interface may be considered as a top surface of the lower portion 110b.

The upper portion 110a has uniform width, and the lower portion 110b has varied width. The upper portion 110a has the first width $W_1$, the interface has the third width $W_3$. The bottom surface of the lower portion 110 has the second width $W_2$. In some embodiments, the first width $W_1$ is greater than the second width $W_2$, and the second width $W_2$ is greater than the third width $W_3$. In some embodiments, the difference ($\Delta W = W_2 - W_3$) between the second width $W_2$ and the third width $W_3$ is in a range from about 0 nm to about 15 nm. If the difference ($\Delta W$) is greater than 15 nm, the gate electrode layer 144 may be difficult to fill into the trench 138 (shown in FIG. 2L) which is formed by removing the dummy gate electrode layer 110. If the difference is smaller than 0 nm, the source/drain (S/D) structures 116 may be difficult to form.

Figure 4E:
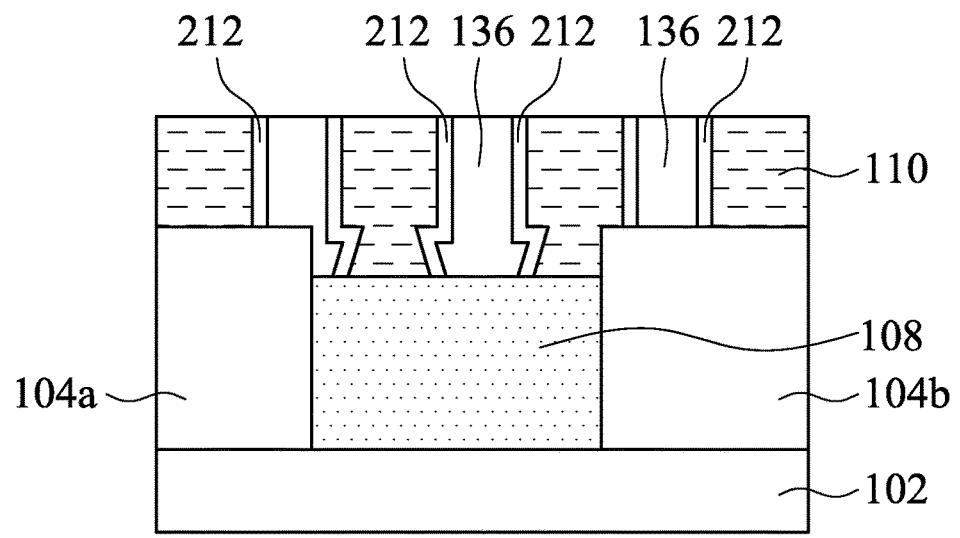

Afterwards, the first hard mask layer 212a and the second hard mask layer 212b are removed, and spacers 212 are formed on opposite sidewall of the dummy gate structure 110. Next, a dielectric material is filled into the trenches 354, 356 and on the gate electrode layer 110 as a mask as shown in FIG. 4E, in accordance with some embodiments of the disclosure.

After dielectric material is filled, a portion of dielectric material out of trenches 354, 356 is removed by a planarizing process, such as a chemical mechanical polishing process (CMP). As a result, the ILD structure 136 is formed. The ILD structure 136 is formed between two adjacent gate structure 146, and ILD structure 136 includes an upper portion and a lower portion, the lower portion is wider than the upper portion.

Figure 4F:
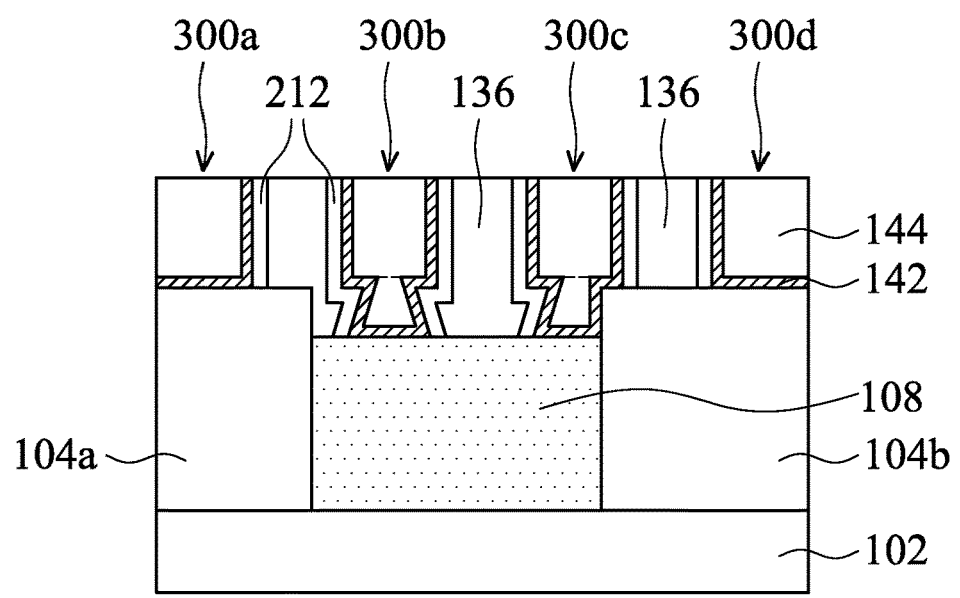

Afterwards, the gate electrode layer 110 is removed to form a trench (not shown), and the gate dielectric layer 142 and the gate electrode 144 are sequentially formed in the trench as shown in FIG. 4F, in accordance with some embodiments of the disclosure. In some embodiments, the gate dielectric layer 142 is a high dielectric constant (high-k) dielectric layer, and the gate electrode 144 is metal gate electrode. In other words, a HK/MG stack structure is formed on the fin structure 104.

As shown in FIG. 4F, the gate dielectric layer 142 and the gate electrode 144 are divided into four parts, and the first transistor 300a, the second transistor 300b, the third transistor 300c and the fourth transistor 300d are formed respectively. Each of the first transistor 300a, the second transistor 300b, the third transistor 300c and the fourth transistor 300d is constructed by the gate dielectric layer 142 and the gate electrode 144. The ILD structure 136 is located between the first transistor 300a and the second transistor 300b. In addition, the ILD structure 136 is located between the third transistor 300c and the fourth transistor 300d.

Figure 5A:
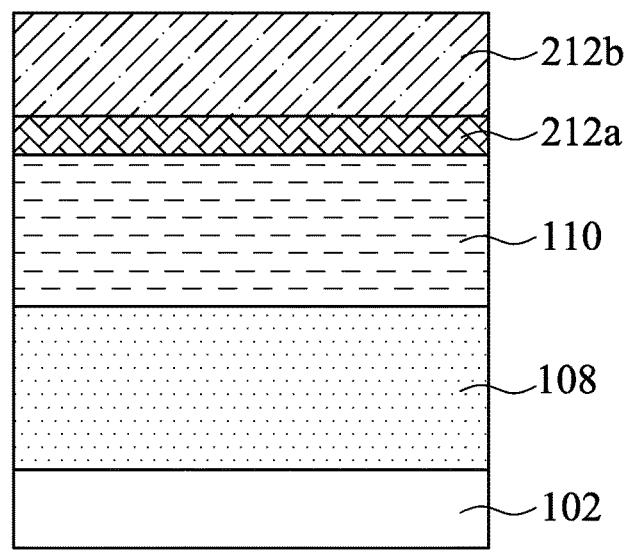
FIGS. 5A-5C show cross-sectional representations of various stages of forming a fin field effect transistor (FinFET) device structure, in accordance with some embodiments of the disclosure.
Figure 5B:
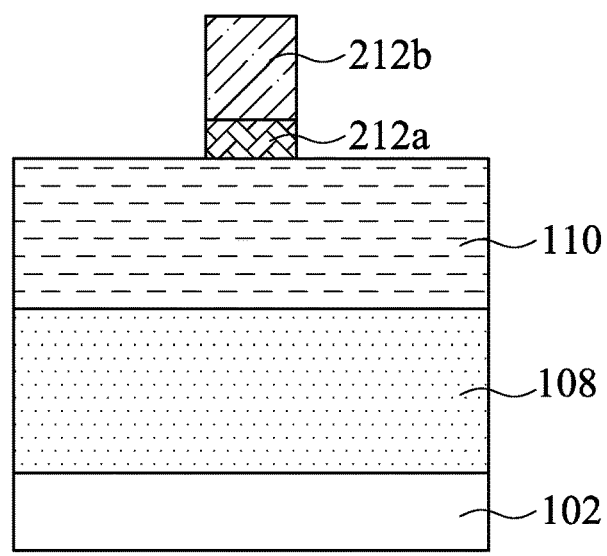
Figure 5C:
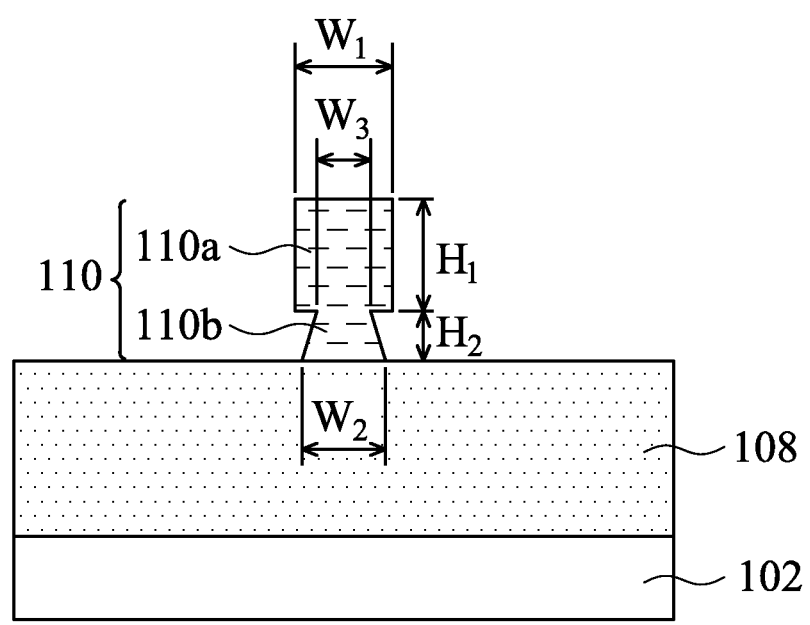

FIGS. 5A-5C show cross-sectional representations of various stages of forming a fin field effect transistor (FinFET) device structure 100, in accordance with some embodiments of the disclosure. FIGS. 5A-5C show cross-sectional representations taken along BB' line of FIG. 3.

As shown in FIG. 5A, the first hard mask layer 212a and the second hard mask layer 212b are formed over the gate electrode layer 110.

Afterwards, the first hard mask layer 212a and the second hard mask layer 212b are patterned to form the patterned first hard mask layer 212a and patterned the second hard mask layer 212b as shown in FIG. 5B, in accordance with some embodiments of the disclosure.

Afterwards, the gate electrode layer 110 is etched by using the patterned first hard mask layer 212a and patterned the second hard mask layer 212b as a mask to from the upper portion 110a and the lower portion 110h as shown in FIG. 5C, in accordance with some embodiments of the disclosure. The upper portion 110a is above a top surface of the fin structure 104 and the lower portion 110b below the top surface of the fin structure 104. The upper portion 110a has vertical sidewalls to prevent the protrusion problem.

The upper portion 110a has a top surface with a first width, and the lower portion 110b has a bottom surface with a second width. The first width is greater than the second width. It should be noted that the drain-induced barrier lowering (DIBL) effect is prevented when the first width is greater than the second width. In addition, the tailing problem (spread Vbd over a broader range of voltage values) of breakdown voltage (Vbd) is prevented when the first width is greater than the second width.

Afterwards, if the gate electrode layer 110 is made of polysilicon, the gate electrode layer 110 will be removed and replaced by a metal gate electrode layer.

Embodiments for forming a semiconductor device structure and method for formation the same are provided. A FinFET device structure includes a fin structure formed over a substrate and a gate structure formed over the fin structure. The gate structure includes an upper portion and a lower portion. The upper portion has a top surface and the lower portion has a bottom surface. The top surface is wider than the bottom surface. The upper portion has vertical sidewalls to prevent the protrusion problem. Therefore, the performance and reliability of the FinFET device structure is improved.

In some embodiments, a fin field effect transistor (FinFET) device structure is provided. The fin field effect transistor (FinFET) device structure includes a fin structure formed over a substrate and a gate structure traversing over the fin structure. The gate structure includes a gate electrode layer which includes an upper portion above the fin structure and a lower portion below the fin structure, the upper portion has a top surface with a first width, and the lower portion has a bottom surface with a second width, and the first width is greater than the second width.

In some embodiments, a fin field effect transistor (FinFET) device structure is provided. The fin field effect transistor (FinFET) device structure includes a fin structure formed over a substrate and an isolation structure formed over the substrate. A portion of the fin structure is embedded in the isolation structure. The fin field effect transistor (FinFET) device structure also includes a first gate structure traversing over the fin structure, and a portion of the first gate structure is formed over the isolation structure. The first gate structure includes a gate electrode layer which includes an upper portion above the fin structure and a lower portion below the fin structure, the upper portion has vertical sidewalls, and the lower portion has sloped sidewalls.

In some embodiments, a method for forming a fin field effect transistor (FinFET) device structure is provided. The method includes forming a fin structure over a substrate and forming an isolation structure over the substrate. A portion of the fin structure is embedded in the isolation structure. The method includes forming a gate structure over the fin structure and the isolation structure, and the gate structure includes a gate electrode layer which includes an upper portion above the fin structure and a lower portion below the fin structure. The upper portion has a top surface with a first width, and the lower portion has a bottom surface with a second width, and the first width is greater than the second width.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET) device structure, comprising: a fin structure formed over a substrate; a gate structure traversing over the fin structure, wherein the gate structure comprises a gate electrode layer which comprises an upper portion above the fin structure, a lower portion below a top surface of the fin structure, and a bottom portion adjacent to an isolation structure, the upper portion has a top surface with a first width, and the lower portion has a bottom surface with a second width, and the first width is greater than the second width, wherein the top surface is planar and extends from one side of the gate structure to an opposite side of the gate; structure, wherein the bottom portion has a third width greater than the second width, and a spacer adjacent to the gate structure, wherein a surface of the spacer facing away from the gate structure conforms to a shape of a sidewall of the gate structure from a first surface of the spacer facing the substrate to a second surface of the spacer opposite the first surface.

2. The fin field effect transistor (FinFET) device structure as claimed in claim 1, wherein a virtual interface is formed between the upper portion and the lower portion, wherein the virtual interface is substantially level with a top surface of the fin structure.

3. The fin field effect transistor (FinFET) device structure as claimed in claim 1, wherein the upper portion of the gate electrode layer has vertical sidewalls.

4. The fin field effect transistor (FinFET) device structure as claimed in claim 1, wherein the lower portion of the gate electrode layer has a trapezoidal shape.

5. The fin field effect transistor (FinFET) device structure as claimed in claim 1, wherein the upper portion of the gate electrode layer has a first height, and the lower portion of the gate electrode layer has a second height, and the first height is greater than the second height.

6. The fin field effect transistor (FinFET) device structure as claimed in claim 1, further comprising:
an isolation structure formed over the substrate, wherein a portion of the gate structure is formed over the isolation structure.

7. The fin field effect transistor (FinFET) device structure as claimed in claim 1, wherein the lower portion has a tapered width which is gradually tapered from the bottom surface of the lower portion to a top surface of the lower portion.

8. The fin field effect transistor (FinFET) device structure as claimed in claim 1, wherein the lower portion of the gate electrode layer has sloped sidewalls.

9. A fin field effect transistor (FinFET) device structure, comprising: a fin structure formed over a substrate; an isolation structure formed over the substrate, wherein a portion of the fin structure is embedded in the isolation structure; a first gate structure traversing over the fin structure, wherein a portion of the first gate structure is formed over the isolation structure, wherein the first gate structure comprises a first gate electrode layer which comprises an upper portion above the fin structure and a lower portion in physical contact with the isolation structure below a top surface of the fin structure, and a bottom portion adjacent to the isolation structure, the upper portion has a top surface with a first width and vertical sidewalls, and the lower portion has a bottom surface with a second width and sloped sidewalls, the lower portion having a decreasing width as the lower portion extends from where the lower portion is in contact with the substrate; the first width is greater than the second width, and the bottom portion has a third width greater than the second width; and a spacer with a first section adjacent to the lower portion of the first gate structure, the first section having a sidewall facing away from the lower portion of the first gate structure, the sidewall facing away from the lower portion of the first gate structure intersecting the isolation structure at an angle less than 90 degrees and greater than zero degrees.

10. The fin field effect transistor (FinFET) device structure as claimed in claim 9, wherein the upper portion of the first gate electrode layer has a first height, and the lower portion of the first gate electrode layer has a second height, and the first height is greater than the second height.

11. The fin field effect transistor (FinFET) device structure as claimed in claim 9, wherein the upper portion has a top surface with a first width, and the lower portion has a bottom surface with a second width, and the first width is greater than the second width.

12. The fin field effect transistor (FinFET) device structure as claimed in claim 9, further comprising:
a second gate structure traversing over the fin structure, wherein a portion of the first gate structure is formed over the isolation structure; and
an inter-layer dielectric layer (ILD) structure formed between the first gate structure and the second gate structure, wherein the ILD structure comprises an upper portion and a lower portion, and the lower portion is wider than the upper portion.

13. The fin field effect transistor (FinFET) device structure as claimed in claim 12, wherein the upper portion of the ILD structure has a constant width, and the lower portion of the ILD structure has a varied width.

14. The fin field effect transistor (FinFET) device structure as claimed in claim 13, wherein the lower portion of the ILD structure has sloped sidewalls which are gradually tapered from a top surface of the lower portion to a bottom surface of the lower portion.

15. A method for forming a fin field effect transistor (FinFET) device structure, comprising:
forming a fin structure over a substrate;
forming an isolation structure over the substrate, wherein a portion of the fin structure is embedded in the isolation structure;

forming a gate structure over the fin structure and the isolation structure, wherein the gate structure comprises a gate electrode layer which comprises an upper portion above the fin structure, a lower portion below a top surface of the fin structure, and a bottom portion adjacent to the isolation structure, the upper portion has a top surface with a first width, the lower portion has a bottom surface with a second width, the first width is greater than the second width, and the bottom portion has a third width greater than the second width;

forming a spacer adjacent to the gate structure, wherein the forming the spacer is performed after the forming the gate structure;

forming an inter-layer dielectric (ILD) structure over the substrate and adjacent to the spacer;

removing the gate structure to form a trench in the ILD structure; and filling a gate dielectric layer and a gate electrode layer in the trench.

16. The method for forming the fin field effect transistor (FinFET) device structure as claimed in claim 15, wherein forming the gate structure over the fin structure and the isolation structure comprises:

forming a gate material over the fin structure and the isolation structure;

forming a hard mask layer over the gate material;

patterning the hard mask layer;

etching the gate material by using the hard mask layer as a mask to form the gate structure.

17. The method for forming the fin field effect transistor (FinFET) device structure as claimed in claim 16, wherein etching the gate material comprises using an etching process, and the etching process is performed at a pressure in a range from about 10 torr to about 100 torr.

18. The fin field effect transistor (FinFET) device structure as claimed in claim 1, further comprising a source/drain region with a larger width than the fin structure underlying the gate structure.

19. The fin field effect transistor (FinFET) device structure as claimed in claim 1, wherein the upper portion has a bottom surface of the upper portion opposite the top surface of the upper portion, the bottom surface of the upper portion being at least partially exposed by the lower portion.

20. The method of claim 15, wherein the lower portion contacts the isolation structure at an angle of other than 90°.

* * * * *